United States Patent
Balamane et al.

(10) Patent No.: US 8,617,408 B2
(45) Date of Patent: Dec. 31, 2013

(54) METHOD FOR MANUFACTURING A MAGNETIC READ SENSOR WITH NARROW TRACK WIDTH USING AMORPHOUS CARBON AS A HARD MASK AND LOCALIZED CMP

(75) Inventors: Hamid Balamane, Portola Valley, CA (US); Patrick M. Braganca, San Jose, CA (US); Jordan A. Katine, Mountain View, CA (US); Jui-Lung Li, San Jose, CA (US); Yang Li, San Jose, CA (US); Kanaiyalal C. Patel, Fremont, CA (US); Neil L. Robertson, Palo Alto, CA (US); Samuel W. Yuan, Saratoga, CA (US)

(73) Assignee: HGST Netherlands B.V., Amsterdam (NL)

( * ) Notice: Subject to any disclaimer, the term of this patent is extended or adjusted under 35 U.S.C. 154(b) by 57 days.

(21) Appl. No.: 13/275,728

(22) Filed: Oct. 18, 2011

(65) Prior Publication Data

US 2013/0092654 A1 Apr. 18, 2013

(51) Int. Cl.
*B44C 1/22* (2006.01)
(52) U.S. Cl.
USPC .............. 216/22; 216/62; 216/67; 29/603.01; 29/603.14
(58) Field of Classification Search
None
See application file for complete search history.

(56) References Cited

U.S. PATENT DOCUMENTS

| 6,700,759 | B1 | 3/2004 | Knapp et al. |
| 7,016,167 | B2 | 3/2006 | Fontana, Jr. et al. |
| 7,419,891 | B1 | 9/2008 | Chen et al. |
| 7,530,158 | B2 | 5/2009 | Araki et al. |
| 7,640,650 | B2 | 1/2010 | Araki et al. |
| 2006/0292705 | A1 | 12/2006 | Hegde et al. |
| 2009/0168253 | A1* | 7/2009 | Araki et al. .................. 360/313 |
| 2009/0266790 | A1* | 10/2009 | Balamane et al. .............. 216/22 |
| 2010/0024201 | A1* | 2/2010 | Le et al. ...................... 29/603.14 |
| 2010/0112487 | A1 | 5/2010 | Le et al. |
| 2010/0326819 | A1* | 12/2010 | Lille et al. ................. 204/192.34 |
| 2011/0089139 | A1 | 4/2011 | Hong |
| 2011/0089140 | A1 | 4/2011 | Hong |

FOREIGN PATENT DOCUMENTS

| JP | 2010033668 A | | 2/2010 | |
| JP | 2010040083 | * | 2/2010 | ............... G11B 5/39 |
| JP | 2010040083 A | | 2/2010 | |

* cited by examiner

*Primary Examiner* — Lan Vinh
*Assistant Examiner* — Jiong-Ping Lu
(74) *Attorney, Agent, or Firm* — Zilka-Kotab, PC

(57) ABSTRACT

A method for manufacturing a magnetic read sensor at very narrow track widths. The method uses an amorphous carbon mask layer to pattern the sensor by ion milling, rather than a mask constructed of a material such as photoresist or DURIMIDE® which can bend over during ion milling at very narrow track widths. By using the amorphous carbon layer as the masking layer, the trackwidth can be very small, while avoiding this bending over of the mask that has been experienced with prior art methods. In addition, the track-width can be further reduced by using a reactive ion etching to further reduce the width of the amorphous carbon mask prior to patterning the sensor. The method also allows extraneous portions of the side insulation layer and hard bias layer to be removed above the sensor by a light CMP process.

4 Claims, 20 Drawing Sheets

METHOD FOR MANUFACTURING A MAGNETIC READ SENSOR WITH NARROW TRACK WIDTH USING AMORPHOUS CARBON AS A HARD MASK AND LOCALIZED CMP

FIELD OF THE INVENTION

The present invention relates to magnetic data recording and more particularly to a method for manufacturing a read sensor that allows the sensor to be constructed at very narrow track widths by using an amorphous carbon mask structure.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft underlayer of the magnetic medium to return to the return pole of the write head.

A magnetoresistive sensor such as a Giant Magnetoresistive (GMR) sensor, or a Tunnel Junction Magnetoresistive (TMR) sensor can be employed to read a magnetic signal from the magnetic media. The sensor includes a nonmagnetic conductive layer (if the sensor is a GMR sensor) or a thin nonmagnetic, electrically insulating barrier layer (if the sensor is a TMR sensor) sandwiched between first and second ferromagnetic layers, hereinafter referred to as a pinned layer and a free layer. Magnetic shields are positioned above and below the sensor stack and can also serve as first and second electrical leads so that the electrical current travels perpendicularly to the plane of the free layer, spacer layer and pinned layer (current perpendicular to the plane (CPP) mode of operation). The magnetization direction of the pinned layer is pinned perpendicular to the air bearing surface (ABS) and the magnetization direction of the free layer is located parallel to the ABS, but free to rotate in response to external magnetic fields. The magnetization of the pinned layer is typically pinned by exchange coupling with an antiferromagnetic layer.

When the magnetizations of the pinned and free layers are parallel with respect to one another, scattering of the conduction electrons is minimized and when the magnetizations of the pinned and free layer are antiparallel, scattering is maximized. In a read mode the resistance of the spin valve sensor changes about linearly with the magnitudes of the magnetic fields from the rotating disk. When a sense current is conducted through the spin valve sensor, resistance changes cause potential changes that are detected and processed as playback signals.

Certain manufacturing limitations, such as those related to mask formation in the patterning of a magnetic sensor have limited the amount by which the width of the sensor can be reduced. Since the width of the sensor determines the track width of the system and also determines the data density, it would be desirable to reduce this track width as much as possible. Therefore, there remains a need for a process that can allow the sensor to be constructed narrower than is possible using currently applied techniques.

SUMMARY OF THE INVENTION

The present invention provides a method for manufacturing a magnetic read sensor that includes forming a magnetic shield and depositing a series of sensor layers over the magnetic shield, followed by an amorphous carbon layer, followed by a hard mask layer. A first photoresist mask is formed over the hard mask layer, the first photoresist mask having a sensor defining portion and first and second openings at first and second sides of the central portion. The sensor defining portion and the first and second openings define a sensor area and areas beyond the sensor area define a field area. A first reactive ion etching is performed to transfer the image of the first photoresist mask onto the hard mask. A second reactive ion etching is performed to transfer the image of the hard mask onto the amorphous carbon layer. An ion milling is then performed to remove a portion of the series of sensor layers that is not protected by the amorphous carbon layer, and a non-magnetic, electrically insulating layer is deposited followed by a magnetic layer. A second photoresist mask is formed that covers the sensor area and leaves the field area uncovered, and a second ion milling is performed to remove portions of the non-magnetic, electrically insulating layer and magnetic material that extend beyond the second mask.

The method advantageously allows a magnetic sensor to be constructed at very narrow track widths. The method uses an amorphous carbon mask layer to pattern the sensor by ion milling, rather than using a mask constructed of a material such as photoresist or DURIMIDE® which can bend over during ion milling at very narrow track widths. By using the amorphous carbon layer as the masking layer, the track-width can be very small while avoiding this bending over of the mask that has been experienced with prior art methods. Also, the amorphous carbon can be thinner than photoresist and/or DURIMIDE®, which reduces shadowing effects during ion milling. In addition, the track-width can be further reduced by using a reactive ion etching to further reduce the width of the amorphous carbon mask prior to patterning the sensor by ion milling. The method also allows extraneous portions of the side insulation layer and hard bias layer to be removed above the sensor by a light CMP process.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
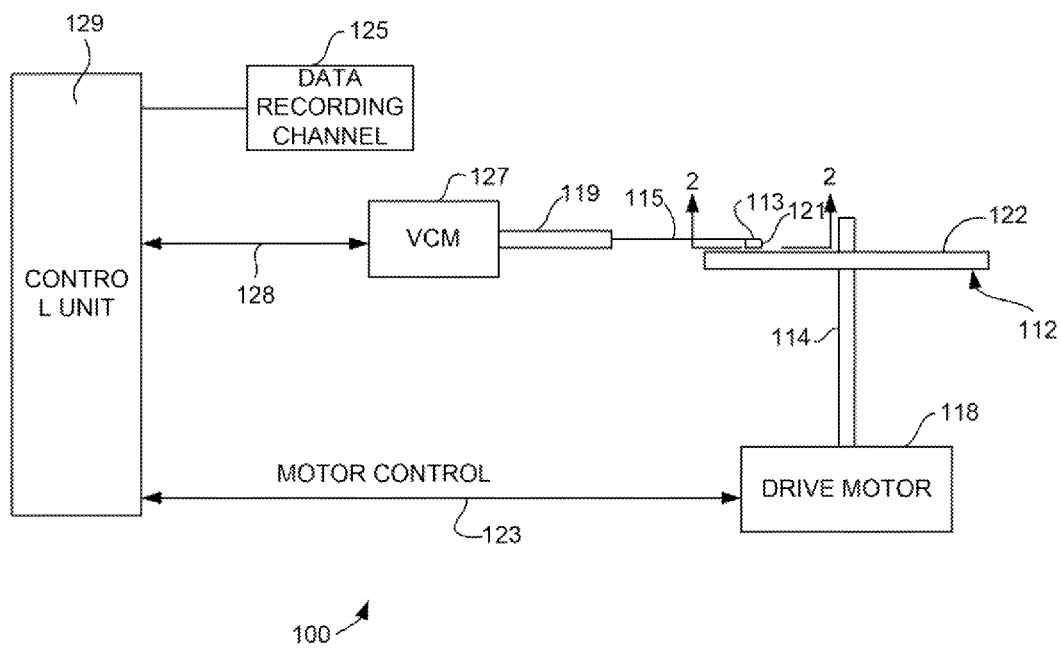
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
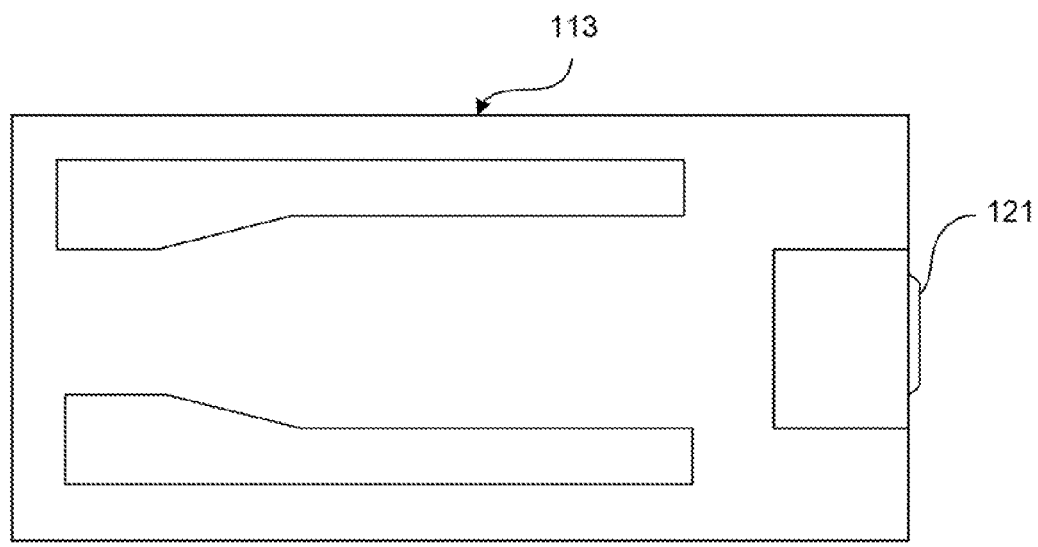
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

Figure 3:
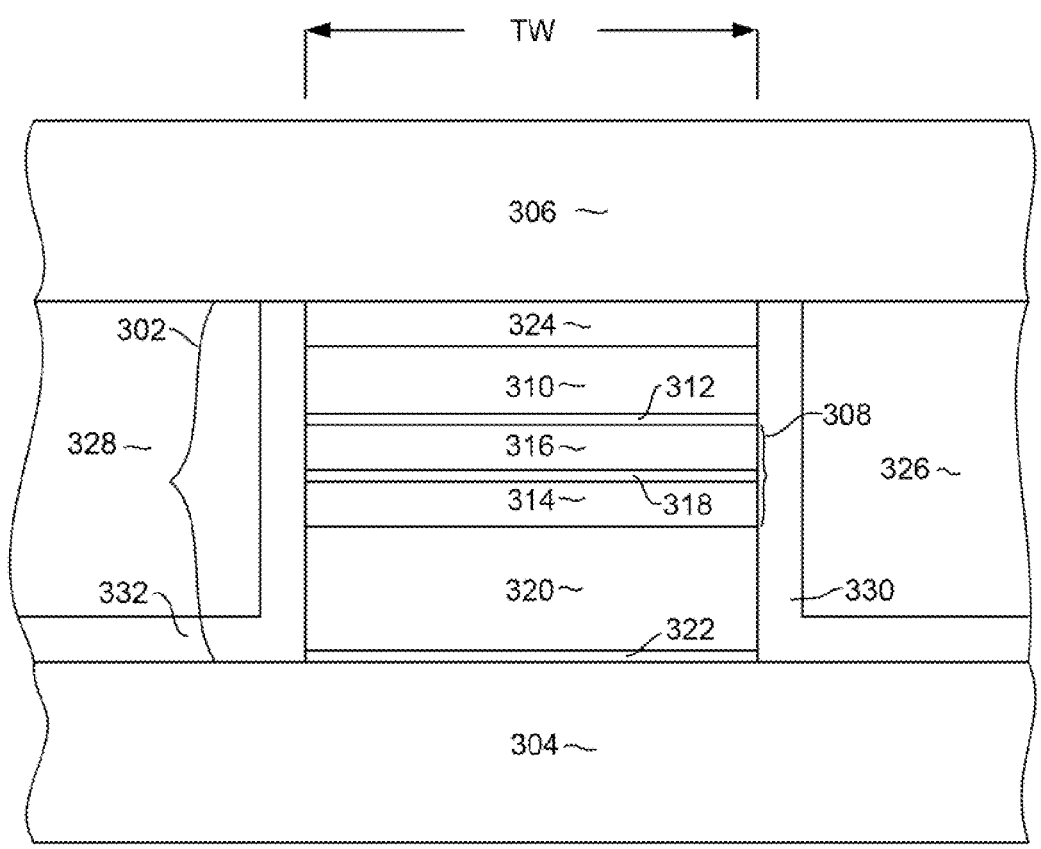
FIG. 3 is an ABS view of a magnetic read head.

FIG. 3 shows a magnetic read sensor 300 as seen from the air bearing surface ABS. As can be seen, the read sensor 300 includes a sensor stack 302 that is sandwiched between first and second magnetic shields 304, 306. The magnetic shields 304, 306 can be constructed of an electrically conductive, magnetic material so that they can function as electrical leads as well as magnetic shields.

The sensor stack 302 can include a pinned layer structure 308, a magnetic free layer structure 310 and a non-magnetic spacer or barrier layer 312 sandwiched between the pinned layer structure 308 and free layer structure 310. The pinned layer structure 308 can include first and second magnetic layers 314, 316 that are antiparallel coupled across a non-magnetic AP coupling layer such as Ru 318 sandwiched there-between. The first magnetic layer 314 can be exchange coupled with a layer of anti ferromagnetic material 320. This exchange coupling strongly pins the magnetization of the first magnetic layer 314 in a first direction perpendicular with the ABS. The antiparallel coupling between the first and second magnetic layers 314, 316 pins the magnetization of the second magnetic layer 316 in a second direction that is antiparallel with the first direction and perpendicular with the ABS.

In addition, the sensor stack 302 may also include a seed layer structure 322 that initiates a desired grain formation in the above formed layers of the sensor stack 302. Also, a capping layer 324 can be provided at the top of the sensor stack 302 to protect the layers of the sensor stack during manufacture.

The sensor 300 may also include first and second hard magnetic bias layers 326, 328 formed at either side of the sensor stack 302 to provide a magnetic bias field to bias a magnetization of the free layer 310 in a desired direction that is substantially parallel with the ABS. First and second non-magnetic electrically insulating layers 330, 322 separate the bias layers 326, 328 from the sides of the sensor stack 302 and from the shield 304 in order to prevent electrical shunting.

As those skilled in the art will appreciate, the sensor stack 302 has a width TW that defines the track width of the sensor. In order to maximize the data density of the recording system it is necessary to minimize this width TW. However, certain manufacturing limitations have limited the amount by which this width TW can be practically reduced. For example, in order to pattern the sensor it has been necessary to construct a photoresist mask having a thickness that is sufficient to withstand the ion milling process used to form the sensor. However, at very narrow track-widths this photoresist becomes unstable and tends to bend over. Another problem that occurs at very narrow track widths is that shadowing from the thick photoresist mask adversely affects the material removal process (e.g. ion milling) used to form sensor, thereby leading to a poorly defined sensor width. The present invention overcomes these limitations to provide a method for manufacturing a sensor stack 302 having a reduced width TW for increased data density.

Figure 4:
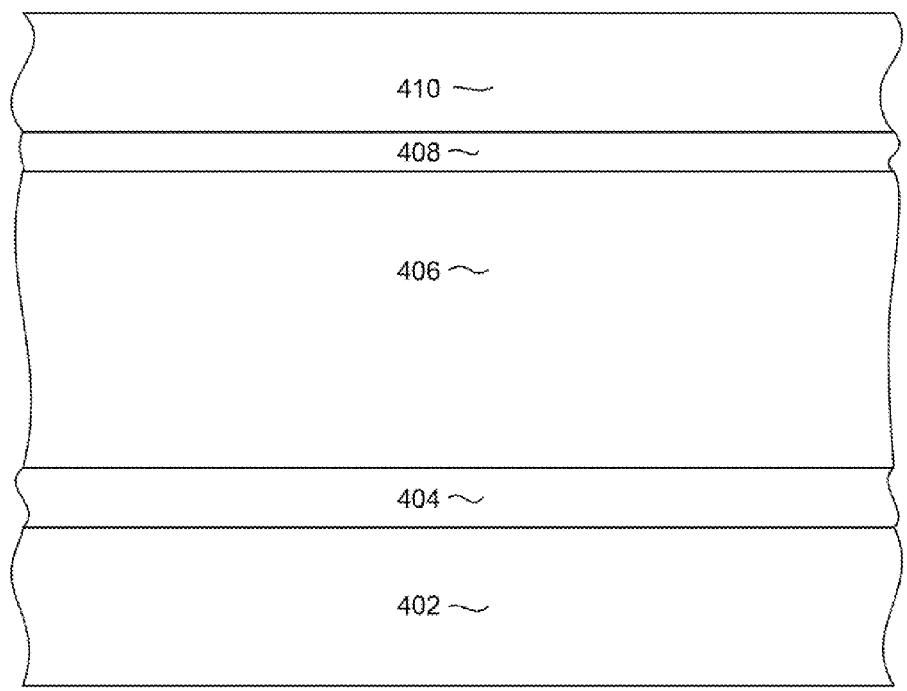
FIGS. 4-20 are views of a magnetic read head in various intermediate stages of manufacture, illustrating a method of manufacturing a magnetic read head according to an embodiment of the invention.
Figure 20:
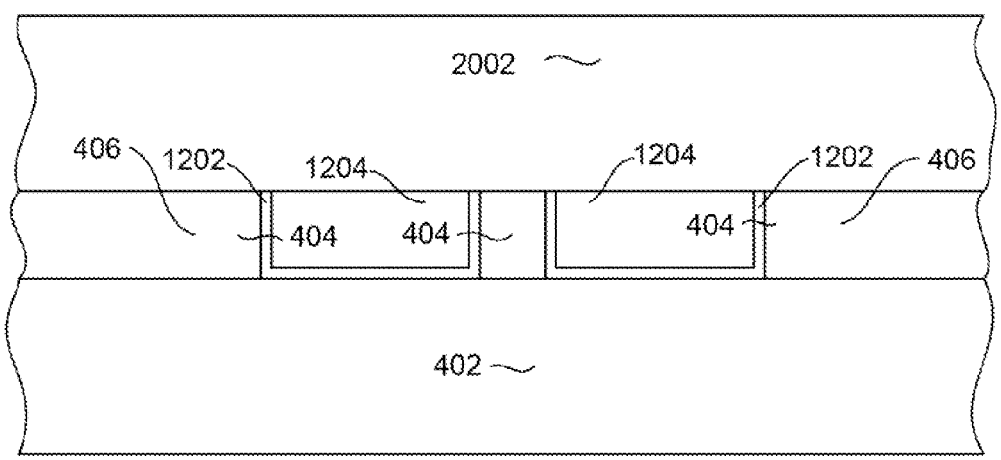

FIG. 20 illustrate a method for manufacturing a read head that overcomes the challenges presented by prior art methods, allowing the read head to be manufactured with a very small track width. With particular reference to FIG. 4, a magnetic shield 402 is formed. This magnetic shield 402 can be constructed of an electrically conductive, magnetic material such as NiFe and can be embedded in a non-magnetic, electrically insulating substrate such as alumina (not shown). A series of magnetic sensor material layers, shown collectively as a single layer 404 in FIG. 4 is deposited over the shield 402. Although shown as a single layer 404 in FIG. 4, it should be understood that the layer 404 actually includes various sensor layers such as those described as the layers of the sensor stack 302 of FIG. 3. However, the specific sensor structure 302 of FIG. 3 is by way of example and the present invention could encompass any type of sensor structure.

A layer of amorphous carbon 406 is deposited over the sensor layers 404. A layer of a material 408 (preferably SiON) that can act as both a hard mask and a bottom anti-reflective coating (BARC) is deposited over the amorphous carbon 406. Then, a layer of photoresist 410 is deposited over the hard mask/antireflective coating layer 408.

A photolithographic patterning process is then used to pattern and develop the photoresist mask 410 to form a mask having openings 502 at either side of a track-width defining covered portion 504. This photolithographic process preferably employs phase shift photolithography to form the track width defining portion 504 with a smaller dimension than would be otherwise possible. Phase shift photolithography utilizes a photolithographic lens that that has one portion with a larger thickness than the other. The differences in thickness cause light through one portion to be 180 degrees out of phase from the other portion. For example, light through one portion of the lens can be used to define the right opening in FIG. 5. Light through the other portion (that is 180 degrees out of phase with the first portion) can be used to define the left opening 402 in FIG. 5. Both of these regions 502 receive light during the patterning, but the light is 180 degrees out of phase. In the central portion 504 the two out of phase light patterns cancel each other out to result in a very narrow area of no light (which defines the portion 504). The layer 408, which is preferably SiON acts as a bottom anti-reflective coating (BARC) to improve photolithographic patterning results.

Figure 5:
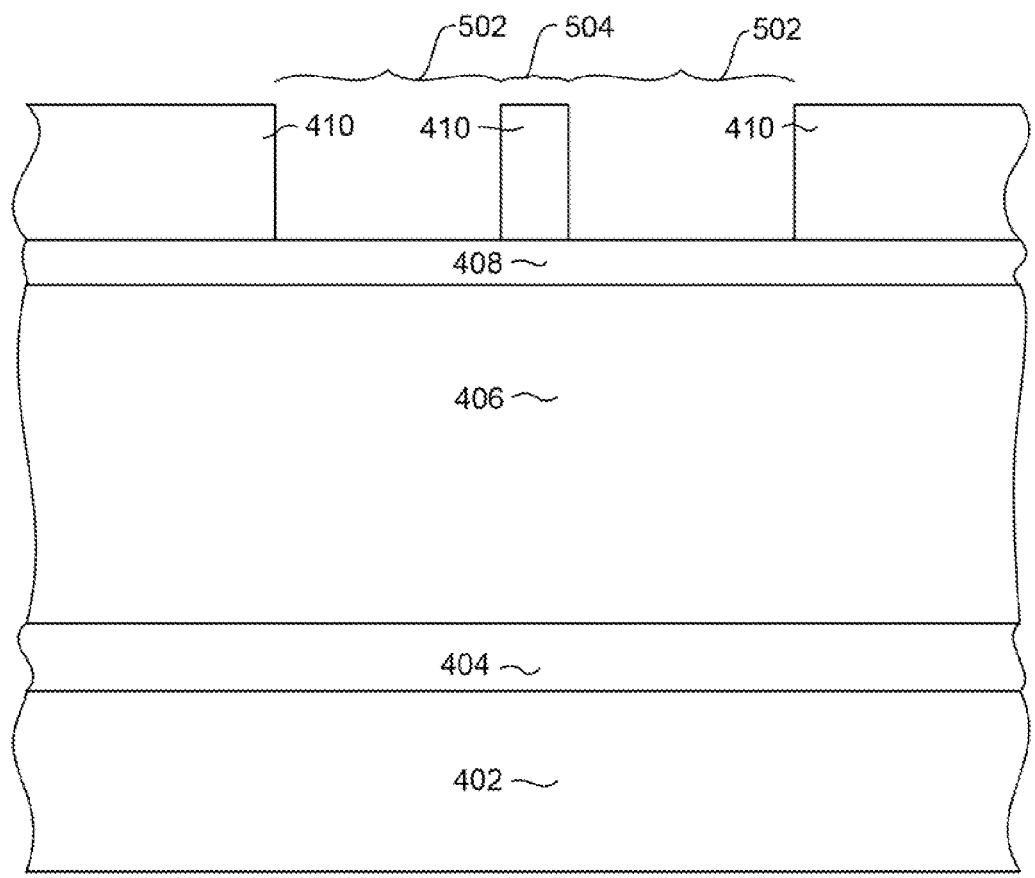
Figure 6:
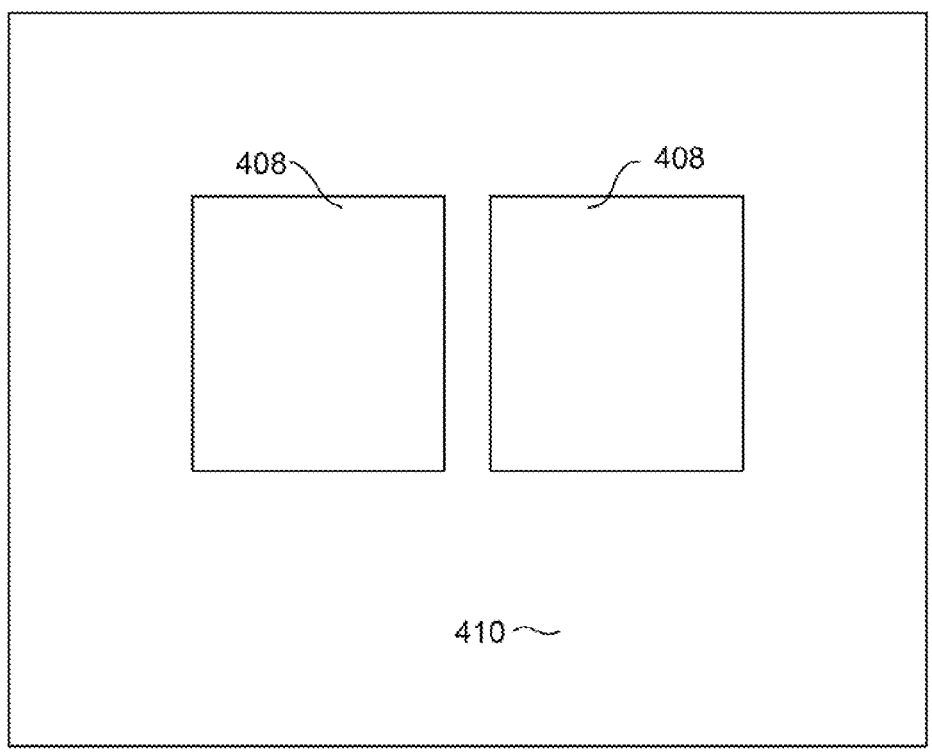

This results in the patterned mask 410 shown in FIG. 5. A top down view more clearly shows the pattern of the mask 410 with the openings exposing the BARC/hard mask layer 408 there-beneath. A reactive ion etching (RIE) can then be performed to remove portions of the BARC/hard mask 408 that are exposed through the openings in the mask 410, leaving a structure such as that shown in FIG. 7. This RIE is preferably performed in a fluorine containing chemistry, which preferentially removes the SiON.

Figure 7:
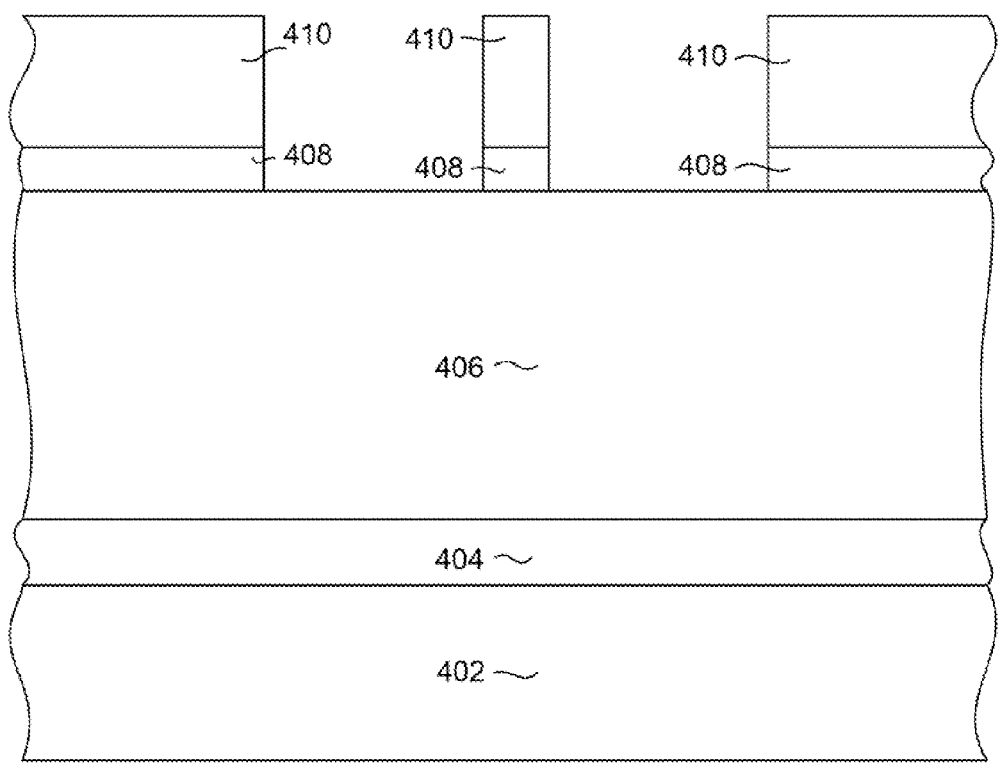
Figure 8:
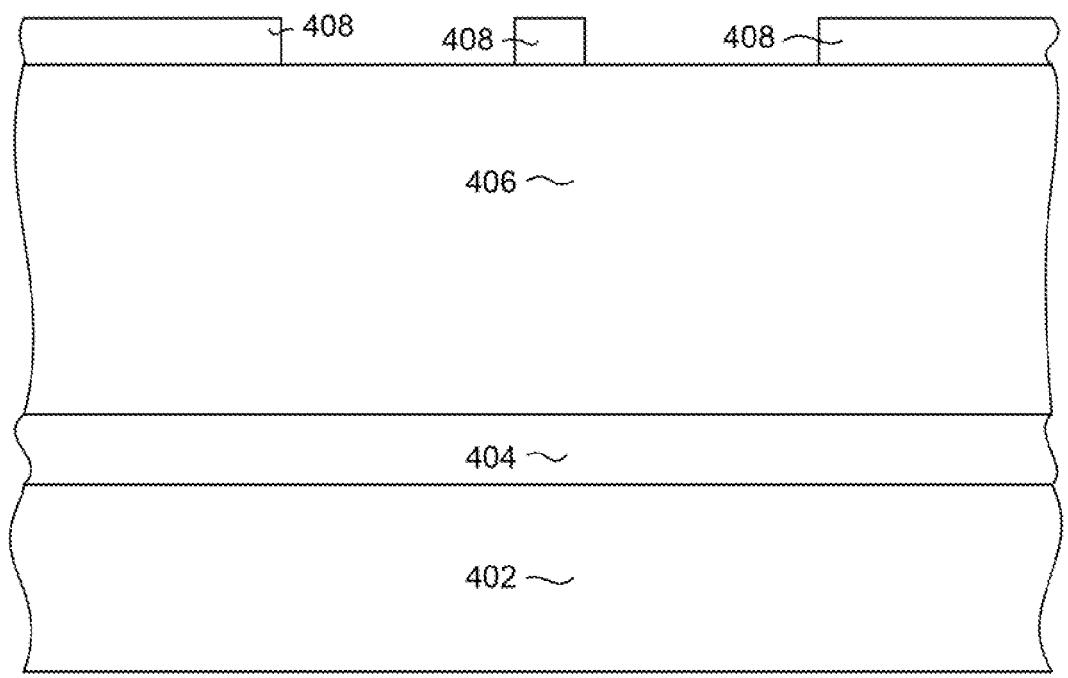
Figure 9:
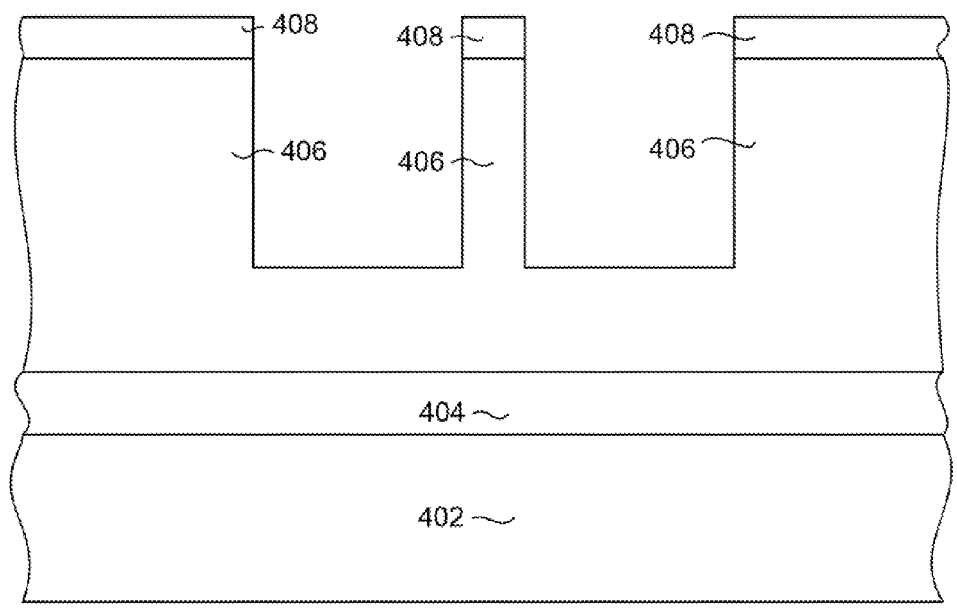
Figure 10:
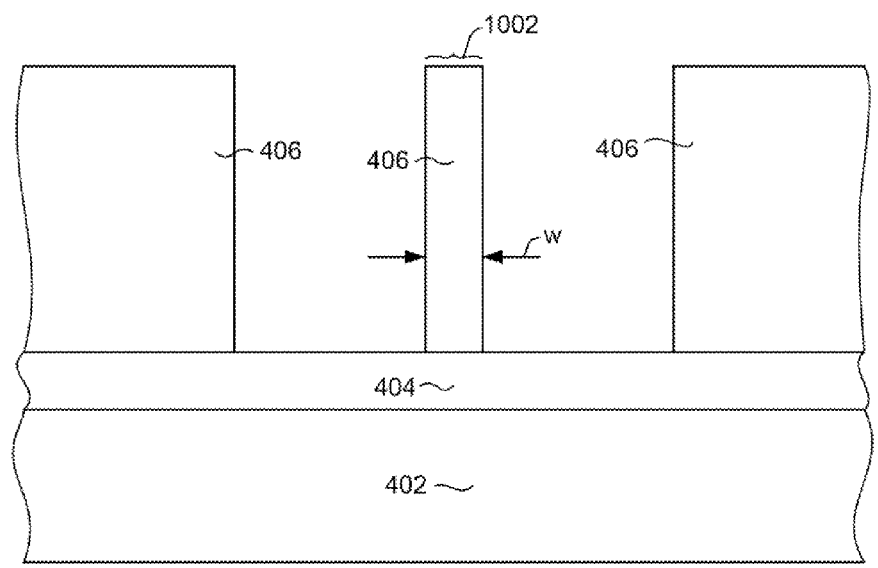

After the image of the photoresist mask 410 has been transferred onto the underlying hard mask layer 408 by the above described RIE, the photoresist can be removed, such as by a chemical liftoff process, leaving a structure as shown in FIG. 8. Then, another reactive ion etching (RIE) is performed to transfer the image of the hard mask 408 onto the underlying amorphous carbon layer 406 by removing portions of the layer 406 that are not protected by the mask 408 as shown in FIG. 9. This second RIE is preferably performed using an oxygen chemistry ($O_2$), which preferentially removes the amorphous carbon 406 much faster than the hard mask 408. However, by the time the sensor layers have been reached, the hard mask 408 will be completely consumed. It should be pointed out that photolithography has limitations as to how narrow a dimension can be performed. In order to reach a desired small track-width target, the second RIE can be continued to further trim the amorphous layer 406, thereby further reducing the width "W" of the central portion 1002 which will define the track width of the sensor. This is a significant advantage of the present invention in that it allows the track-width to be controllably reduced even beyond the resolution capabilities of the photolithographic process used to pattern the photoresist layer 410 (FIG. 7).

Figure 11:
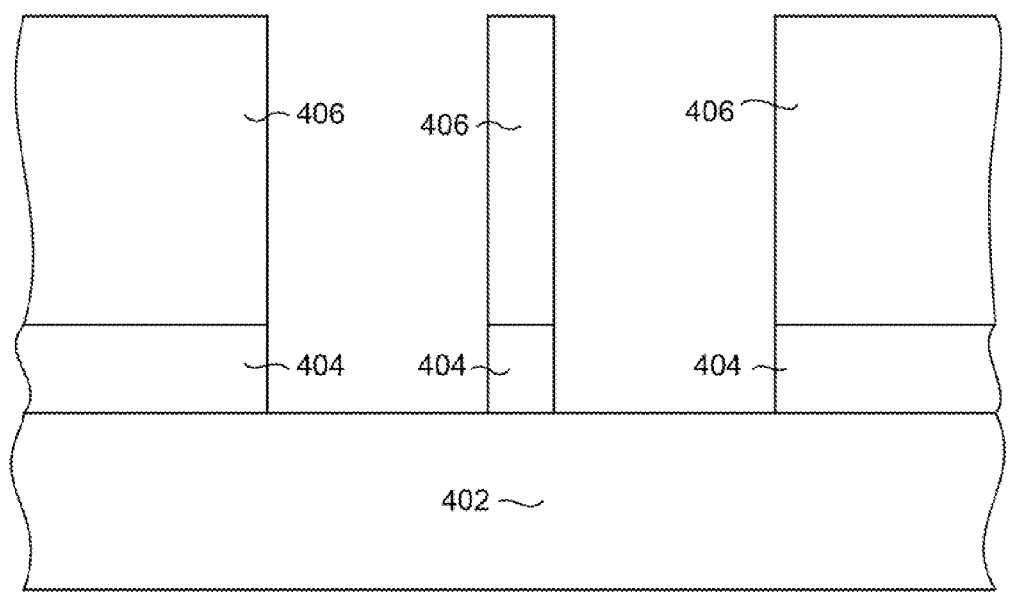

With reference now to FIG. 11, after the amorphous carbon mask 406 has been trimmed to the desired width W, an ion milling is performed to transfer the image of the amorphous carbon layer 406 onto the underlying sensor layers 404 by removing exposed portions of the sensor layers 404 to define, a sensor width.

Figure 12:
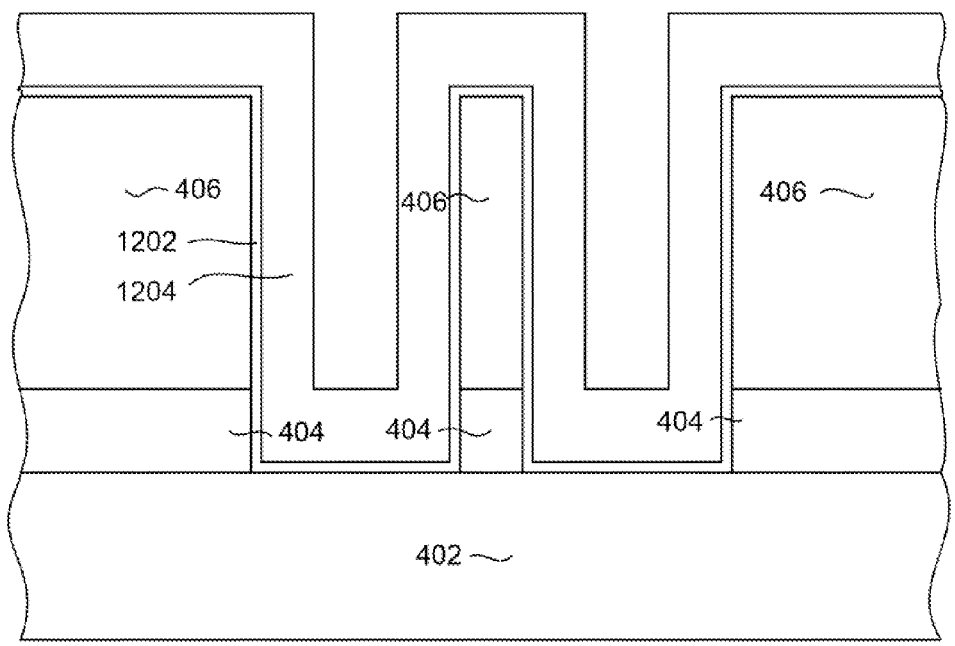

Then, with reference to FIG. 12, a thin layer of non-magnetic, electrically insulating material 1202 is deposited followed by a layer 1204 of hard magnetic material. The insulation layer 1202 is preferably alumina and is preferably deposited by a conformal deposition method such as atomic layer deposition (ALD). The magnetic material 1204 provides the hard magnetic bias layers 326, 328 described above with reference to FIG. 3. The magnetic layer is a magnetic material having a high coercivity, such as CoPt or CoPtCr.

Figure 13:
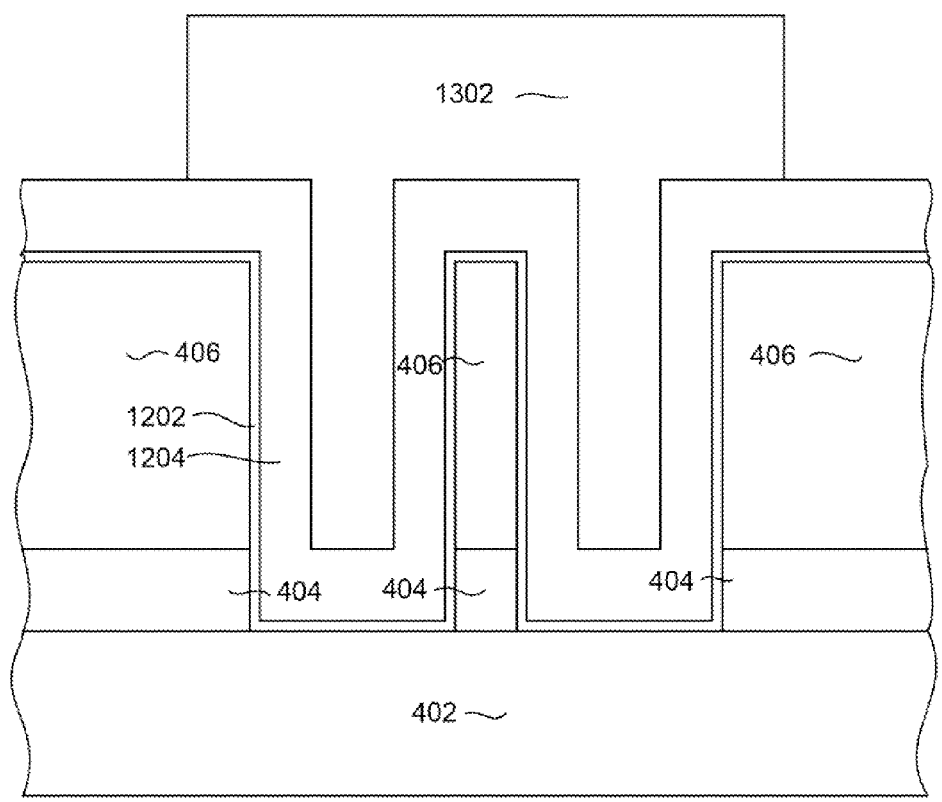
Figure 14:
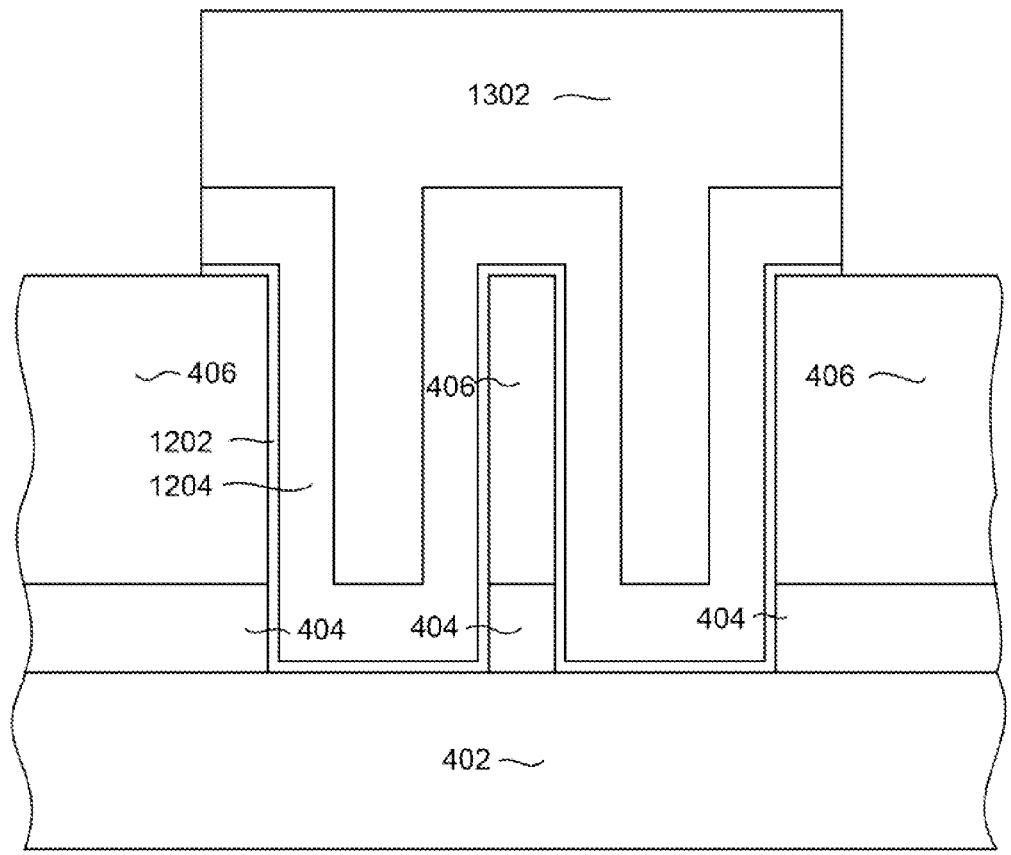

Thereafter, a photoresist mask 1302 is formed to cover an area just beyond the sensor area and leaving areas in the field uncovered, as shown in FIG. 13. An ion milling is then performed to remove portions of the hard magnetic material 1204 and insulation layer 1202 that are not protected by the mask 1302 (i.e. in the field area), leaving a structure such as that shown in FIG. 14 with the ion milling stopping on the amorphous carbon layer 406. The photoresist mask 1302 can then be lifted off, leaving a structure such as that shown in FIG. 15.

Figure 16:
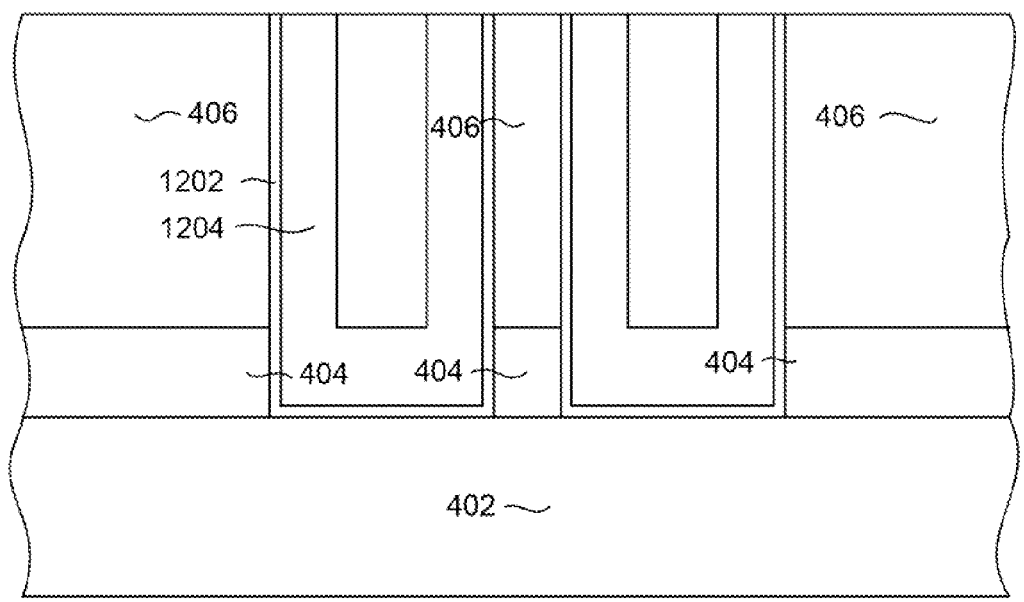
Figure 17:
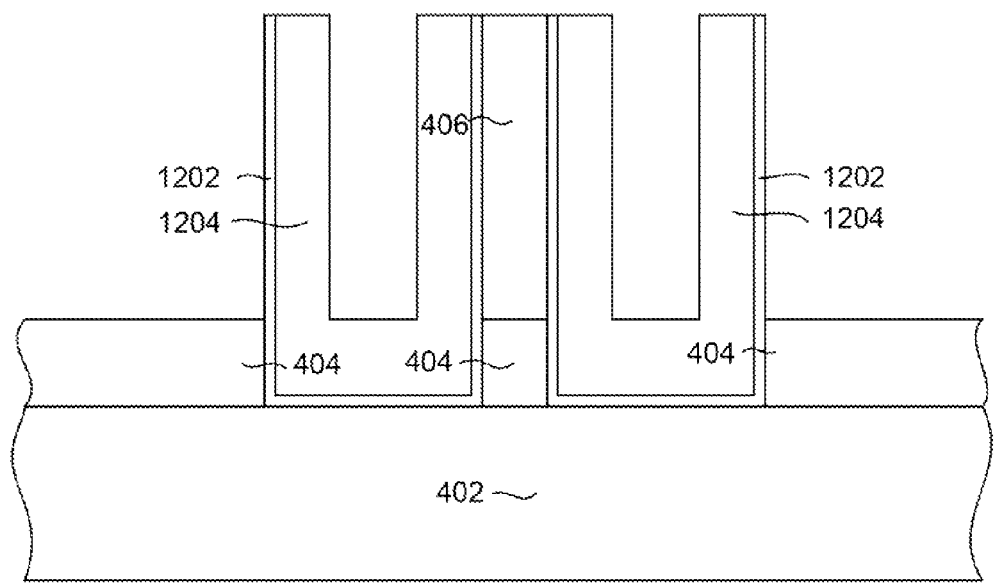
Figure 18:
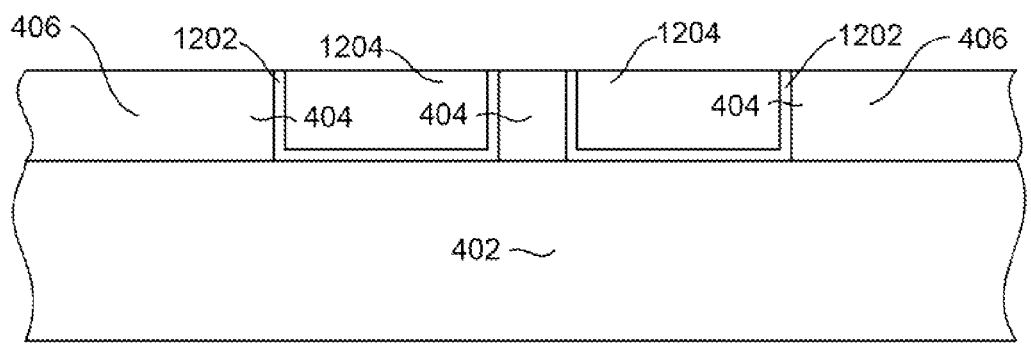

In a first variation of the method, after removing the mask 1302 a quick chemical mechanical polishing, also referred to as a nano-CMP, can be performed to remove the remaining portions of magnetic material 1204 and insulation layer 1202 that extend above the amorphous carbon layer 406, leaving a structure as shown in FIG. 16. Then, a reactive ion etching (RIE), performed in an oxygen ($O_2$) chemistry is performed to remove the amorphous carbon layer 406, leaving a structure as shown in FIG. 17. An Eco snow process is performed to remove the upward extending portions of the hard magnetic material 1204 and 1202. Eco snow is a cleaning process using high pressure $CO_2$. This can be followed by a quick chemical mechanical polishing process, if necessary, to further remove any remaining bumps of material 1202, 1204, leaving a structure as shown in FIG. 18.

Figure 15:
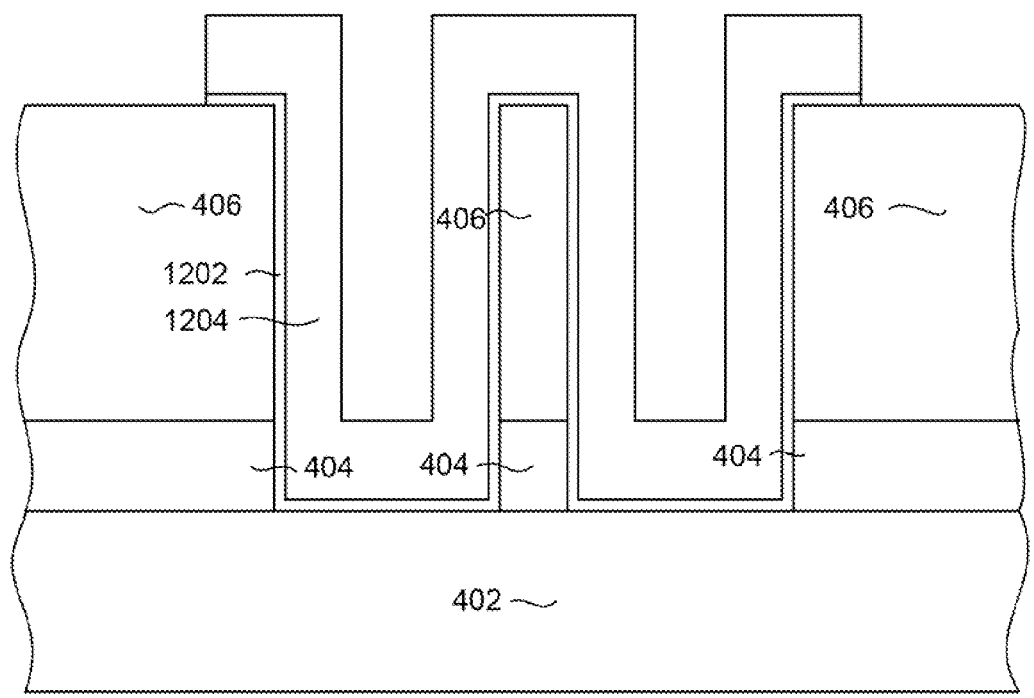
Figure 19:
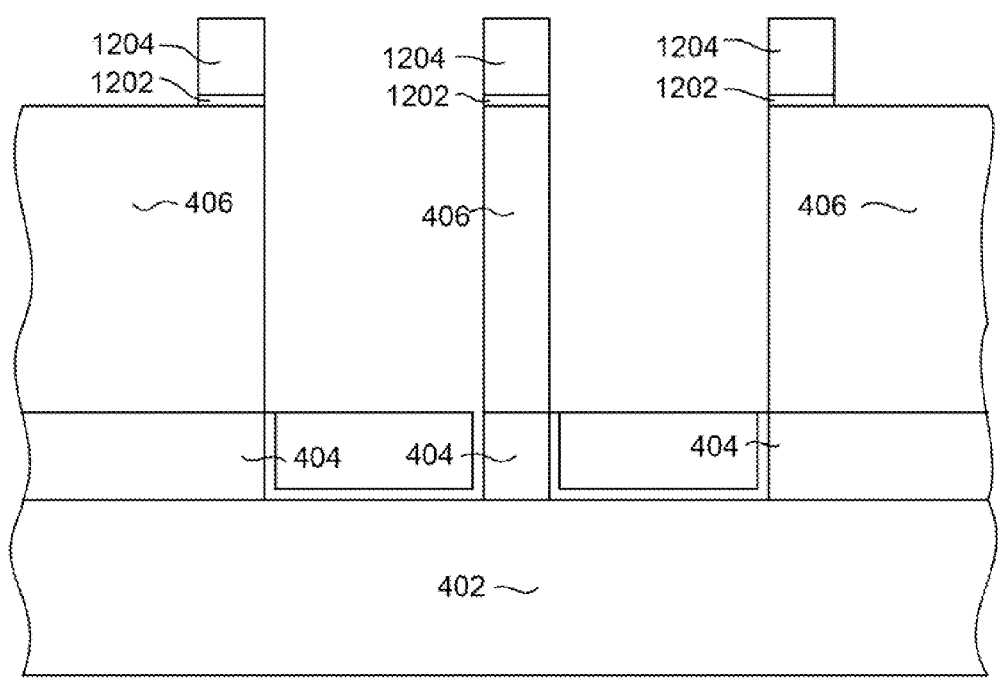

In an alternate variation of the method, starting with the structure as shown and described with reference to FIG. 15, a high angle ion milling is performed to remove a portion of the layers 1202, 1204, leaving a structure as shown in FIG. 19. This can be followed by: (1) a reactive ion etching performed in an oxygen ($O_2$) chemistry; (2) a water cleaning; and (3) a chemical mechanical polishing, leaving the structure as shown in FIG. 18. Then, with reference to FIG. 20, a top magnetic shield 2002 can be formed by electroplating a magnetic, electrically conductive material such as NiFe.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:
1. A method for manufacturing a magnetic read sensor comprising:
forming a magnetic shield;
depositing a series of sensor layers over the magnetic shield;

forming an amorphous carbon mask over the series of sensor layers, the amorphous carbon mask having first and second openings at first and second sides of a central trackwidth defining portion, the first and second openings and central trackwidth defining portion defining a sensor area;

performing a first ion milling to remove portions of the series of sensor layers that are exposed through the openings in the amorphous carbon layer;

depositing a non-magnetic, electrically insulating material followed by a magnetic material;

forming a photoresist mask over the sensor area;

performing a second ion milling to remove portions of the non-magnetic, electrically insulating material and the magnetic material that are not protected by the photoresist mask;

removing the photoresist mask;

performing a third ion milling to remove the non-magnetic, electrically insulating material and the magnetic material from side portions of the amorphous carbon layer; and performing a reactive ion etching to remove the remaining amorphous carbon layer.

2. The method as in claim 1 further comprising, after performing the reactive ion etching, performing a water cleaning and a chemical mechanical polishing.

3. The method as in claim 1 wherein the reactive ion etching is performed in an oxygen chemistry.

4. The method as in claim 1 wherein the third ion milling is performed at an angle relative to normal.

* * * * *